United States Patent [19]

Yoshizumi et al.

[11] Patent Number: 5,043,211

[45] Date of Patent: Aug. 27, 1991

[54] EPOXY RESIN COMPOSITION AND A RESIN-SEALED SEMICONDUCTOR DEVICE

[75] Inventors: Akira Yoshizumi; Kazutaka Matsumoto, both of Yokohama; Shinetsu Fujieda, Kawasaki; Ken Uchida, Tokyo, all of Japan

[73] Assignee: Kabushiki Kaisha Toshiba, Kawasaki, Japan

[21] Appl. No.: 175,225

[22] Filed: Mar. 30, 1988

[30] Foreign Application Priority Data

Mar. 31, 1987 [JP] Japan .................. 62-78649

[51] Int. Cl.$^5$ .................. B32B 27/18; B32B 27/38; C08K 3/36; C08K 9/06
[52] U.S. Cl. .................. 428/331; 174/52.2; 428/413; 523/209; 523/466; 523/438
[58] Field of Search .................. 523/209, 466, 438; 428/413, 414, 415, 331; 174/52.2

[56] References Cited

U.S. PATENT DOCUMENTS 4,529,755  7/1985  Nishikawa .................. 525/92
4,786,675  11/1988  Iwata .................. 523/456

FOREIGN PATENT DOCUMENTS 0041662  12/1981  European Pat. Off.
0064611  11/1982  European Pat. Off. .......... 523/466
54-54168  4/1979  Japan .
58-34824  3/1983  Japan .
58-210920  12/1983  Japan .
62-22825  1/1987  Japan .
2236821  10/1987  Japan .................. 523/209

OTHER PUBLICATIONS

Patent Abstracts of Japan, vol. 11, No. 200 (C-431) [2647], 27th Jun. 1987, Abstract of JP-A-62 22 825, Jan. 31, 1987.
Patent Abstracts of Japan, vol. 11, No. 232 (C-437) [2679], 29th Jul. 1987, Abstract of JP-A-62 45 615, Feb. 27, 1987.
Patent Abstracts of Japan, vol. 12, No. 467 (C-550) [3314], 7th Dec. 1988, p. 47 C550, Abstract of JP-A-63 186 724, Aug. 2, 1988.
Patent Abstracts of Japan, vol. 11, No. 307 (C-450) [2754], 7th Oct. 1987, Abstract of JP-A-62 96 522, May 6, 1987.
Patent Abstracts of Japan, vol. 12, No. 69 (E-587) [2916], 3rd Mar. 1988, Abstract of JP-A-62 210 654, Sep. 16, 1987.
Kakiuchi, Kiso Kobunshi Kagaku [Basic High Polymers Chemistry], (Soukoudo, Japan, 1971), pp. 50-56.
Brandrup et al., (Editors), *Polymer Handbook*, Second Edition, (John Wiley & Sons, New York, 1981), pp. II-105, II-156, II-251 and II-321.

*Primary Examiner*—Jenna Davis
*Attorney, Agent, or Firm*—Oblon, Spivak, McClelland, Maier & Neustadt

[57] ABSTRACT

An epoxy resin composition useful for sealing a semiconductor device includes 100 parts by weight of epoxy resin, 30–75 parts by weight of phenolic resin, 320–570 parts by weight of silica powder, and 2–30 parts by weight of styrene-butadiene-methyl methacrylate copolymer. The surface of the silica powder is treated, at room temperature, by 0.05–1.00% by weight of silane coupling agent, 0.05–1.00% by weight of a silicone base surface active agent, and 0.15–3.00% by weight of thermosetting silicone rubber.

8 Claims, 1 Drawing Sheet

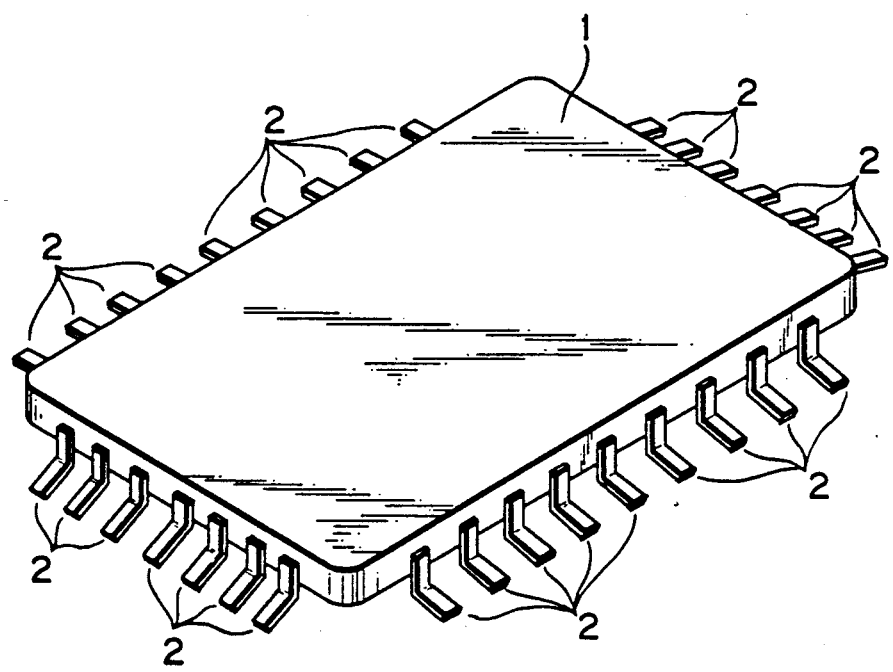

EPOXY RESIN COMPOSITION AND A RESIN-SEALED SEMICONDUCTOR DEVICE

BACKGROUND OF THE INVENTION

1. Field of the Invention

This invention relates to an epoxy resin composition and a resin-sealed semiconductor device.

2. Description of the Related Art

Epoxy resin possesses excellent mechanical, electrical insulation, and moisture-proofing properties, and is widely used as a highly reliable insulating material in semiconductor devices, electronic parts, and in the sealing and impregnation of electrical parts. Regarding the sealing of semiconductor devices, in particular, the main tendency goes toward the sealing based on the application of resin, particularly epoxy resin which can be manufactured in larger quantities and at lower cost than in the hermetic sealing process involving the use of ceramic material or metals.

The type of properties which are most required of resin employed as semiconductor-sealing material are that the resin be highly corrosion-proof, so as to prevent the metal (particularly aluminium) applied on the surface of a semiconductor element from deteriorating through breakage resulting from corrosion; and that the resin have high resistance to thermal impact, in order to protect a metal wire connecting a semiconductor element to a frame from being broken by thermal shock. Recently, the high integration of a semiconductor element has made it necessary to be fine line pattern, to enlarge the semiconductor chip, to decrease the volume of the resin package and reduce its thickness. When such a thin miniaturized resin package (the so-called flat package) is applied on a printed circuit board, the package has to withstand a solder temperature of 260° C. for 5 to 10 seconds. However, a flat package has a thin wall, both on the top and bottom walls of a semiconductor element. Therefore, when the flat package is dipped in molten solder kept at a temperature of 260° C., this may give rise to cracks appearing in the resin constituting the package or the moisture-proofing properties of the resin may deteriorate. It has customarily been applied to decrease the internal stress of the resin, as a means for resolving the above-mentioned problem. To this end, natural rubber, for example, has been added to the epoxy resin. However, the resultant denatured resin has the defect in that its moisture-proofing properties are weakened.

The conventional epoxy resin composition has drawbacks in that it undergoes great internal stress. When, therefore, a large semiconductor chip is sealed in the prior art resin composition, the metal bonding wire is a resin-molded semiconductor device is broken; cracks may appear in the resin itself; dipping in the molten solder causes the resin to readily fall off the frame; and the moisture-proofing properties of the resin deteriorate.

SUMMARY OF THE INVENTION

This invention has been developed in view of the above-mentioned circumstances, and is intended to provide an epoxy resin composition which is improved over the conventional epoxy resin composition, is subject to low stress, possesses high adhesiveness to the material constituting a frame, and is highly moisture-proof, and is further intended to provide a method of manufacturing highly reliable resin-sealed semiconductor devices.

The present invention also aims at the manufacture of an epoxy resin composition which has a low content of $\alpha$ rays and which, when applied as a memory element, can suppress the occurrence of soft errors.

An epoxy resin composition embodying the present invention comprises (A) 100 parts by weight of epoxy resin;

(B) 30-75 parts by weight of phenolic resin;

(C) 320-570 parts by weight of silica powder whose surface is treated, at room temperature, with
  (i) 0.05-1.00% by weight of silane coupling agent,
  (ii) 0.05-1.00% by weight of silicone-base surface-active agent, and
  (iii) 0.15-3.00% by weight of thermosetting silicone rubber; and (D) 2-30 parts by weight of styrene-butadiene-methyl methacrylate copolymer (MBS).

The semiconductor devices embodying this invention is sealed in the cured material of the above-mentioned epoxy resin composition.

BRIEF DESCRIPTION OF THE DRAWINGS

The accompanying drawing is an oblique view of a flat package of a semiconductor apparatus embodying the present invention.

DESCRIPTION OF THE PREFERRED EMBODIMENTS

An epoxy resin composition representing the present invention comprises four essential components, (A)–(D).

(A) is epoxy resin. Any known type of epoxy resin may be used. For the object of this invention, it is possible to employ an epoxy resin wherein one molecule contains two or more epoxy groups such as bisphenol A type epoxy resin; phenol novolak type epoxy resin; cresol novolak type epoxy resin; glycidyl ester type epoxy resin; glycidyl amine type epoxy resin; linear aliphatic epoxy resin; alicyclic epoxy resin; heterocyclic epoxy resin; and halogenated epoxy resin. The above-listed epoxy resins may be applied in the form of a mixture of two or more types.

An epoxy resin applied to this invention should preferably contain less than 10 ppm chlorine ion and less than 0.1% by weight of hydrolyzed chlorine. For the object of the present invention, the most preferred epoxy resin is the glycidyl ether type. A resin-sealed semiconductor device embodying the invention exhibits the most ideal properties particularly when the resin is of the novolak type epoxy resin having 170 to 300 epoxy equivalence.

(B) represents phenolic resins acting as the hardening agent of the epoxy resin component of (A). Phenolic resins applicable for the object of this invention may be listed as follows: phenol novolak resin, cresol novolak resin, tert-butylphenol novolak resin, and nonyl phenol novolak resin; cresol type phenolic resin; bisphenolic A resin; phenol aralkyl resin; dicyclopentadiene phenolic resin and other denatured phenol resins.

The above-listed resins may be applied in the form of a mixture involving two or more types. For instance, when 10 to 70% by weight of phenol novolak resin is replaced by phenol aralkyl resin, adhesion to a semiconductor device is improved, thereby elevating the resistance of the mixture to the corrosive effects of the molten solder when the mixture is dipped therein.

Epoxy resins belonging to Group (A) and phenol resins belonging to Group (B) should preferably be mixed in such ratio that the epoxy equivalent of the epoxy resin should bear the ratio of 0.5 to 1.5 to the equivalent of the phenolic hydroxyl groups of the phenolic resin (epoxy equivalent/OH equivalent). If the equivalent ratio exceeds the above-defined range, a decline will undesirably appear in the mechanical strength of the hardened epoxy resin composition.

(C) The components under this item of the epoxy resin composition embodying the present invention include: silica powder treated at room temperature by (i) a silane coupling agent, (ii) a silicone base surface-active agent and (iii) a thermosetting silicone rubber. The silica powder may consist of the powder, of fused silica or crystalline silica. The silica powder may assume a lumpy, spherical, or fibrous shape. In this connection, the silica powder is prepared in order to apply crude silica cut to a proper particle size, such as 200 or 300 mesh, for the object of preventing damage to a semiconductor device or imparting easy moldability or low stress to the device. Where a semiconductor device such as a memory element is sealed in an epoxy resin composition, it is preferable to apply fused silica powder containing less than 1.0 ppb of uranium or thorium, in order to reduce the occurrence of soft errors.

The silane coupling agent applied to treat the silica powder may be classified as follows:

(i) vinyl tris($\beta$-methoxyethoxy) silane; $\gamma$-methacryloxy propyl trimethoxy silane; $\beta$-(3,4-epoxycyclohexyl) ethyl-trimethoxy silane; $\gamma$-mercaptopropyl trimethoxy silane; $\gamma$-aminopropyltriethoxy silane; N-$\beta$-aminoethyl-$\gamma$-aminopropyl trimethoxy silane; and $\gamma$-ureido propyl triethoxy silane. Most preferred among those listed above are $\beta$-(3,4-epoxycyclohexyl)ethyl-trimethoxy silane and $\gamma$-glycidoxy propymethoxy silane. The above-listed silane coupling agents may be used in a combination of two or more components.

(ii) The second component used to treat silica powder is a silicone base surface-active agent. Preferred among the silicone base surface-active agent is silicone base nonionic surface-active agent. Listed below the concrete examples: SH-3749 (manufactured by Toray Silicone Co., with a viscosity of 1300 cp); SF-8410 (manufactured by Toray Silicone Co., with a viscosity of 2900 cst); and SF-8421 (manufactured by Toray Silicone Co., with a viscosity of 3500 cst). As viewed from the moldability of an epoxy resin composition, SF-8421 is most preferred. This last-mentioned silicone-base nonionic surface-active agent SF-8421 is epoxy group-containing ether-denatured silicone oil. This product is represented by the undermentioned chemical formula:

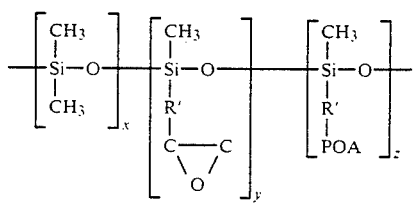

where:
R' = alkyl group

POA = polyether such as polyethylene glycol, polypropylene glycol and copolymer of ethylene glycol and propylene glycol.

Further, the present invention admits the application of polyether-denatured silicone oil set forth in "Organic Synthetic Chemistry" Vol. 40, No. 6, p 576.

A third component (iii) used in the treatment of silica powder applied in the present invention is thermosetting silicone rubber. This thermosetting silicone rubber may be prepared from any type of commonly named liquid silicone rubber having a satisfactory fluidity at room temperature. For the object of the present invention, however, liquid silicone rubber which readily hardens at room temperature is not preferred. However, for the purposes of the present invention, a type of liquid silicone rubber which can harden at a higher recommended temperature than 100° C. is also suitable.

The above-mentioned type of silicone rubber generally hardens according to the undermentioned formula:

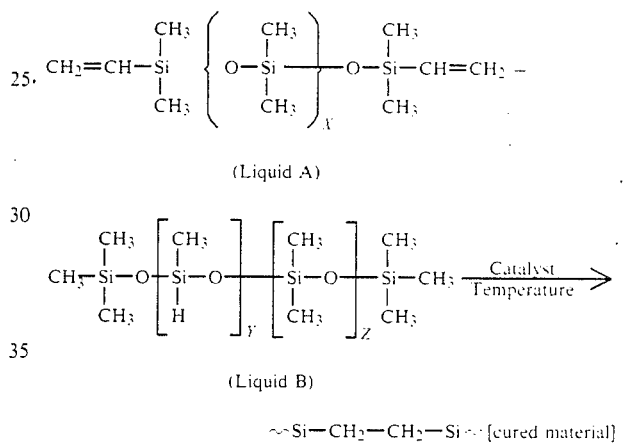

(Liquid A)

(Liquid B)

$\sim$Si—CH$_2$—CH$_2$—Si$\sim$ [cured material]

The above-mentioned liquid A is silicone oil having a vinyl group. Liquid B is silicone oil having an Si—H group. Both liquids are generally hardened by means of a platinum catalyst. The concrete examples of the above-mentioned liquid silicone oil are listed below:

TSJ-3150 (manufactured by Toshiba Silicone Co., with a viscosity of 1100 cp at 25° C.; recommended hardening temperature: 150° C.)

TSJ-3151 (manufactured by Toshiba Silicone Co., with a viscosity of 2300 cp at 25° C.; recommended hardening temperature: 150° C.)

TSJ-3175 (manufactured by Toshiba Silicone Co., with a viscosity of 3100 cp at 25° C.; recommended hardening temperature: 150° C.)

TSJ-3130 (manufactured by Toshiba Silicone Co., with a viscosity of 3800 cp at 25° C.; recommended hardening temperature: 150° C.)

TSE-3051 (manufactured by Toshiba Silicon Co., with a viscosity of 700 cp at 25° C.; recommended hardening temperature: 125° C.)

From the viewpoint of electrical properties, TSJ-3151 and TSE-3051 are preferred.

It is advisable to treat silica powder by the above-listed treating components (i)–(iii), through the step of blending the silica powder, in a mixer such as Henschel mixer, a ball mill, or a V-type blender for several minutes at room temperature (10° to 35° C.). In this blending step, the treating component (i) is applied at a rate of 0.05–1.00% by weight of the silica powder. If the rate of addition of the treating component (i) falls below 0.05% by weight, it is impossible to provide the silica powder with a sufficient degree of moistureproofing. Conversely, if the content of the treating component rises above 1.00% by weight, the silica powder will not have sufficient mechanical strength. Consequently, it is advisable to apply the treating component (i) within a range of 0.3 to 0.7% by weight.

The rate of addition of the treating component (ii) should preferably range between 0.05 and 1.00% by weight of the silica powder. If the rate of addition falls below 0.05% by weight, the silica powder will not have a sufficiently high adhesiveness to, for example, the frame and chip of the semiconductor device. If the content of the treating component exceeds 1.00% by weight, the electrical insulation properties of the silica powder will be insufficient. Therefore, the treating component (ii) should preferably be applied within the range of 0.3 to 0.7% by weight.

The treating component (iii) should preferably be added to the silica powder to an extent ranging between 0.15 and 3.00% by weight. If the rate of addition is less than 1.5% by weight, then the resultant mixture will not have sufficient adhesiveness to the frame metal of the semiconductor devices. Conversely, if the rate of addition of the silica powder-treating agent exceeds 3.00% by weight, the resultant mixture will not have satisfactory moldability. Therefore, the preferred addition should be 0.6-1.8% by weight.

(D) The fourth essential component of the epoxy resin composition representing the present invention is a copolymer of styrene-butadiene-methyl methacrylate (MBS). Component (D) reduces the surface clouding of the final molded product by silicone, and allows the final product to be low stress. Component (D) is rubber powder of vinyl copolymer type generally referred to as MBS resin. This rubber powder is produced by the undermentioned process.

100 parts by weight of latex, containing 40 parts by weight of styrene-butadiene rubber (SBR) having a particle size of 0.1 micron, and 150 parts by weight of water are first mixed together. Added to this mixture are 0.15 parts by weight of sodium sulfoxylate formaldehyde, 33 parts by weight of styrene, and 0.2 part by weight of cumene hydroperoxide. This mixture is then poured into a sealed vessel. Stirring is continued for 5 hours at 60° C., thereby polymerizing substantially all the styrene contained in the SBR latex. Later, the resultant product is blended with 27 parts by weight of methyl methacrylate and 0.2 part by weight of cumene hydroperoxide, and polymerization continues for 4 hours. The resultant grafted latex is coagulated, filtered, washed, and dried to provide MBS resin.

MBS resin containing 70% by weight of butadiene can be produced by a process similar to that mentioned above. This product can be employed as component (D) of this invention. The aforementioned MBS resin is already commercially available. Concrete examples may be listed as follows:

Kaneace B-22 manufactured by Kanegafuchi Chemical Co., containing about 45% of butadiene;
Kaneace B-28 manufactured by Kanegafuchi Chemical Co., containing about 45% of butadiene;
Kaneace B-56 manufactured by Kanegafuchi Chemical Co., containing about 65% of butadiene;
JSR MBS 66 manufactured by Japan Synthetic Rubber Co., containing about 60% of butadiene;
JSR MBS 67 manufactured by Japan Synthetic Rubber Co., containing about 60% of butadiene;
JSR MBS 68 manufactured by Japan Synthetic Rubber Co., containing about 60% of butadiene.

Preferred among the above-listed products are JSR MBS 66, 67, 68, and Kaneace B-56, all containing a large amount of butadiene. Further, MBS resin should preferably consist of fine powders having a particle size smaller than 350 microns, in order for it to be uniformly dispersed throughout the epoxy resin composition.

The epoxy resin composition embodying the present invention is prepared by thoroughly mixing the above-mentioned components (A)-(D), for example, by use of a mixer, and further thermally mixing by use of a heated roll, or by blending by means of a kneader.

In addition to the aforementioned essential components (A)-(D), the epoxy resin composition embodying this invention may be mixed together with a required amount of curing accelerators such as imidazole or its derivatives, derivatives of tertiary amine, phosphine or its derivatives; releasing agents such as natural wax, synthetic wax, metal salts of linear aliphatic acids, acid amide or ester and paraffin; flame-retardant agents, such, as bromotoluene, hexabromobenzene, and antimony trioxide; coloring agents such as carbon black; and any other customarily applied additives.

An epoxy resin composition representing the present invention can be molded into a desired shape by means of compression molding, transfer molding, or injection molding of the components, and later, the application of a proper hardening process.

The encapsulation of a semiconductor devices by an epoxy resin composition embodying the present invention may be performed by means of the most common low-pressure transfer molding technique. However, the encapsulation process can be performed by means of injection molding, compression molding, or casting. After the curing step, the epoxy resin composition is thermally hardened. It is most preferable that the hardening process be performed at a temperature higher than 150° C.

The type of semiconductor devices encapsulated by an epoxy resin composition representing the present invention includes an integrated circuit devices, large scale integrated devices, transistor devices, thyristor devices, diode devices, and memory devices. However, the application of the invention is not limited to the devices listed above.

The appended drawing is an oblique view of a flat package 1 prepared from a cured epoxy resin composition embodying this invention. Reference numeral 2 denotes an external lead extending outward from a semiconductor device sealed in package 1.

This invention will become more apparent by reference to the following examples:

EXAMPLES 1-20 AND CONTROLS 1-9

The components shown in Table 1 below were applied in the percentages given therein.

First, the components of filler (fused silica powder, antimony trioxide powder, and carbon black powder) were mixed together, in Henschel mixer. Later, a silane coupling agent, silicone base surface active agent, and thermosetting silicone rubber were added to the above-mentioned mixture. The mixture was thoroughly stirred at room temperature, and the surface of the filler was treated with this mixture. Residue components were added to the surface-treated filler, and the resulting substance was kneaded in a biaxial heating roll, whereby 20 different epoxy resin compositions (Examples 1-20) were prepared.

The other epoxy resin compositions were also produced from the components given in Table 2 (Controls 1-9).

TABLE 1

| | Raw Materials | Contents | Example 1 | 2 | 3 | 4 | 5 | 6 | 7 | 8 | 9 | 10 |
|---|---|---|---|---|---|---|---|---|---|---|---|---|
| (A) | Orthocresol novolak type epoxy resin | Epoxy equivalent 197. Softening temp. 74° C. | 85 | 85 | 85 | 85 | 85 | 85 | 85 | 85 | 85 | 85 |
| | Brominated bisphenol A-type epoxy resin | Epoxy equivalent 460. Br 49%. Softening temp. 87° C. | 15 | 15 | 15 | 15 | 15 | 15 | 15 | 15 | 15 | 15 |
| (B) | Novolak type phenolic resin | OH equivalent 105. Softening temp. 88° C. | 45 | 45 | 45 | 45 | 45 | 45 | 45 | 45 | 45 | 45 |
| | Phenol aralkyl resin | OH equivalent 176. Softening temp. 97° C. | 0 | 0 | 0 | 0 | 0 | 0 | 0 | 0 | 0 | 0 |
| (i) | $\gamma$-glycidoxypropyl trimethoxy silane | A-187 (UCC Japan) | 2 | 2 | 2 | 2 | 2 | 2 | 2 | 2 | 2 | 2 |
| (ii) | Epoxypolyether denatured silicone oil | SF-8421 (Toray Silicone Co.) | 2 | 1 | 0.5 | 1 | 1 | 1 | 1 | 1 | 1 | 1 |
| (iii) | Thermosetting silicone rubber | TSE-3051 (Toshiba Silicone Co.) | 6 | 6 | 6 | 3 | 1 | 6 | 6 | 6 | 6 | 6 |
| | Thermosetting silicone rubber | TSJ-3150 (Toshiba Silicone Co.) | 0 | 0 | 0 | 0 | 0 | 0 | 0 | 0 | 0 | 0 |
| | Thermosetting silicone rubber | TSJ-3151 (Toshiba Silicone Co.) | 0 | 0 | 0 | 0 | 0 | 0 | 0 | 0 | 0 | 0 |
| (D) | Styrene-butadiene-MMA copolymer | B-56 (Kanegafuchi Chemical Co.) | 6 | 6 | 6 | 6 | 6 | 3 | 12 | 24 | 6 | 6 |
| | Styrene-butadiene-MMA copolymer | 68 K4 (Japan Synthetic Rubber Co.) | 0 | 0 | 0 | 0 | 0 | 0 | 0 | 0 | 0 | 0 |
| | Fused silica powder | Average particle size 20 microns | 430 | 430 | 430 | 430 | 430 | 430 | 430 | 430 | 550 | 340 |
| | Fused silica powder | Average particle size 20 microns. U. Th content 0.2 ppb | 0 | 0 | 0 | 0 | 0 | 0 | 0 | 0 | 0 | 0 |
| | Antimony trioxide | Average particle size 1 micron | 12 | 12 | 12 | 12 | 12 | 12 | 12 | 12 | 12 | 12 |
| | Triphenyl phosphine catalyst | | 1 | 1 | 1 | 1 | 1 | 1 | 1 | 1 | 1 | 1 |
| | Calnauba wax | | 2 | 2 | 2 | 2 | 2 | 2 | 2 | 2 | 2 | 2 |
| | Carbon black coloring agent | | 2 | 2 | 2 | 2 | 2 | 2 | 2 | 2 | 2 | 2 |

| | Raw Materials | Contents | Example 11 | 12 | 13 | 14 | 15 | 16 | 17 | 18 | 19 | 20 |
|---|---|---|---|---|---|---|---|---|---|---|---|---|
| (A) | Orthocresol novolak type epoxy resin | Epoxy equivalent 197. Softening temp. 74° C. | 85 | 85 | 85 | 85 | 85 | 85 | 85 | 85 | 85 | 85 |
| | Brominated bisphenol A-type epoxy resin | Epoxy equivalent 460. Br 49%. Softening temp. 87° C. | 15 | 15 | 15 | 15 | 15 | 15 | 15 | 15 | 15 | 15 |
| (B) | Novolak type phenolic resin | OH equivalent 105. Softening temp. 88° C. | 45 | 45 | 45 | 40 | 35 | 30 | 25 | 45 | 30 | 30 |
| | Phenol aralkyl resin | OH equivalent 176. Softening temp. 97° C. | 0 | 0 | 0 | 10 | 20 | 30 | 40 | 0 | 30 | 30 |
| (i) | $\gamma$-glycidoxypropyl trimethoxy silane | A-187 (UCC Japan) | 2 | 2 | 2 | 2 | 2 | 2 | 2 | 2 | 2 | 2 |
| (ii) | Epoxypolyether denatured silicone oil | SF-8421 (Toray Silicone Co.) | 1 | 1 | 1 | 1 | 1 | 1 | 1 | 1 | 1 | 1 |
| (iii) | Thermosetting silicone rubber | TSE-3051 (Toshiba Silicone Co.) | 0 | 0 | 6 | 6 | 6 | 6 | 6 | 6 | 6 | 6 |
| | Thermosetting silicone rubber | TSJ-3150 (Toshiba Silicone Co.) | 6 | 0 | 0 | 0 | 0 | 0 | 0 | 0 | 0 | 0 |
| | Thermosetting silicone rubber | TSJ-3151 (Toshiba Silicone Co.) | 0 | 6 | 0 | 0 | 0 | 0 | 0 | 0 | 0 | 0 |
| (D) | Styrene-butadiene-MMA copolymer | B-56 (Kanegafuchi Chemical Co.) | 6 | 6 | 0 | 6 | 6 | 6 | 6 | 6 | 6 | 0 |
| | Styrene-butadiene-MMA copolymer | 68 K4 (Japan Synthetic Rubber Co.) | 0 | 0 | 6 | 0 | 0 | 0 | 0 | 0 | 0 | 0 |
| | Fused silica powder | Average particle size 20 microns | 430 | 430 | 430 | 430 | 430 | 430 | 430 | 0 | 0 | 0 |
| | Fused silica powder | Average particle size 20 microns. U. Th content 0.2 ppb | 0 | 0 | 0 | 0 | 0 | 0 | 0 | 430 | 430 | 430 |
| | Antimony trioxide | Average particle size 1 micron | 12 | 12 | 12 | 12 | 12 | 12 | 12 | 12 | 12 | 12 |
| | Triphenyl phosphine catalyst | | 1 | 1 | 1 | 1 | 1 | 1 | 1 | 1 | 1 | 1 |
| | Calnauba wax | | 2 | 2 | 2 | 2 | 2 | 2 | 2 | 2 | 2 | 2 |
| | Carbon black coloring agent | | 2 | 2 | 2 | 2 | 2 | 2 | 2 | 2 | 2 | 2 |

TABLE 2

| | Raw Materials | Contents | Control 1 | 2 | 3 | 4 | 5 | 6 | 7 | 8 | 9 |
|---|---|---|---|---|---|---|---|---|---|---|---|
| (A) | Orthocresol novolak type epoxy resin | Epoxy equivalent 197. Softening temp. 74° C. | 85 | 85 | 85 | 85 | 85 | 85 | 85 | 85 | 85 |
| | Brominated bisphenol A-type epoxy resin | Epoxy equivalent 460. Br 49%. Softening temp. 87° C. | 15 | 15 | 15 | 15 | 15 | 15 | 15 | 15 | 15 |
| (B) | Novolak type phenolic resin | OH equivalent 105. Softening temp. 88° C. | 45 | 45 | 45 | 45 | 45 | 45 | 45 | 45 | 45 |
| | Phenol aralkyl resin | OH equivalent 176. Softening temp. 97° C. | 0 | 0 | 0 | 0 | 0 | 0 | 0 | 0 | 0 |
| (i) | γ-glycidoxypropyl trimethoxy silane | A-187 (UCC Japan) | 0 | 2 | 2 | 2 | 2 | 5 | 2 | 2 | 2 |
| (ii) | Epoxypolyether denatured silicone oil | SF-8421 (Toray Silicone Co.) | 0 | 0 | 1 | 1 | 1 | 5 | 1 | 1 | 1 |
| (iii) | Thermosetting silicone rubber | TSE-3051 (Toshiba Silicone Co.) | 0 | 0 | 0 | 6 | 0 | 6 | 16 | 6 | 6 |
| | Thermosetting silicone rubber | TSJ-3150 (Toshiba Silicone Co.) | 0 | 0 | 0 | 0 | 0 | 0 | 0 | 0 | 0 |
| | Thermosetting silicone rubber | TSJ-3151 (Toshiba Silicone Co.) | 0 | 0 | 0 | 0 | 0 | 0 | 0 | 0 | 0 |
| (D) | Styrene-butadiene-MMA copolymer | B-56 (Kanegafuchi Chemical Co.) | 0 | 0 | 0 | 0 | 6 | 6 | 6 | 6 | 6 |
| | Styrene-butadiene-MMA copolymer | 68 K4 (Japan Synthetic Rubber Co.) | 0 | 0 | 0 | 0 | 0 | 0 | 0 | 0 | 0 |
| | Fused silica powder | Average particle size 20 microns | 430 | 430 | 430 | 430 | 430 | 430 | 430 | 300 | 600 |
| | Fused silica powder | Average particle size 20 microns. U. Th content 0.2 ppb | 0 | 0 | 0 | 0 | 0 | 0 | 0 | 0 | 0 |
| | Antimony trioxide | Average particle size 1 micron | 12 | 12 | 12 | 12 | 12 | 12 | 12 | 12 | 12 |
| | Triphenyl phosphine catalyst | | 1 | 1 | 1 | 1 | 1 | 1 | 1 | 1 | 1 |
| | Carnauba wax | | 2 | 2 | 2 | 2 | 2 | 2 | 2 | 2 | 2 |
| | Carbon black coloring agent | | 2 | 2 | 2 | 2 | 2 | 2 | 2 | 2 | 2 |

Test pieces were formed of all the above-mentioned epoxy resin compositions, by means of transfer molding for 3 minutes at a temperature of 175° C. All the samples were subjected to after-curing for 4 hours, at a temperature of 180° C. All the samples were tested with respect to volume resistivity, thermal expansion coefficient, flexural strength, and flexural modulus. In addition, the resin samples were molded on the frame material of a semiconductor device which consisted of an iron-nickel alloy (Ni 42%), in order to check their adhesiveness to the frame material. Later, the samples were hardened and then a vertically-acting load was applied to the alloy plate. The maximum load which caused peeling of the adhered hardened resin was measured. the results being set out in Table 3 below.

TABLE 3

| | Volume resistivity 150° C. ($\Omega \cdot cm$) | Thermal expansion coefficient (1/°C.) | Glass transition temperature (°C.) | Flexural strength (kg/mm$^2$) | Flexural modulus (kg/mm$^2$) | Adhesiveness (kg/cm$^2$) | Moldability check observation | Ray dose C/cm$^2 \cdot$ h |
|---|---|---|---|---|---|---|---|---|
| (Example) | | | | | | | | |
| 1 | $1.0 \times 10^{14}$ | $1.7 \times 10^{-5}$ | 157 | 14.2 | 1320 | 1.5 | good | 0.1 |
| 2 | $1.0 \times 10^{14}$ | $1.7 \times 10^{-5}$ | 156 | 14.1 | 1330 | 1.4 | " | — |
| 3 | $1.0 \times 10^{14}$ | $1.7 \times 10^{-5}$ | 156 | 14.2 | 1310 | 1.2 | " | — |
| 4 | $1.0 \times 10^{14}$ | $1.7 \times 10^{-5}$ | 157 | 14.3 | 1340 | 1.3 | " | — |
| 5 | $1.1 \times 10^{14}$ | $1.7 \times 10^{-5}$ | 156 | 14.2 | 1340 | 1.2 | " | — |
| 6 | $0.9 \times 10^{14}$ | $1.6 \times 10^{-5}$ | 156 | 14.2 | 1350 | 1.4 | " | — |
| 7 | $1.0 \times 10^{14}$ | $1.8 \times 10^{-5}$ | 154 | 14.1 | 1300 | 1.4 | " | — |
| 8 | $1.0 \times 10^{14}$ | $1.9 \times 10^{-5}$ | 151 | 13.6 | 1270 | 1.4 | " | — |
| 9 | $1.1 \times 10^{14}$ | $1.5 \times 10^{-5}$ | 156 | 13.9 | 1320 | 1.2 | " | — |
| 10 | $1.0 \times 10^{14}$ | $1.9 \times 10^{-5}$ | 155 | 14.4 | 1330 | 1.7 | " | — |
| 11 | $1.0 \times 10^{14}$ | $1.7 \times 10^{-5}$ | 154 | 14.2 | 1330 | 1.5 | " | — |
| 12 | $1.1 \times 10^{14}$ | $1.7 \times 10^{-5}$ | 155 | 14.1 | 1340 | 1.4 | " | — |
| 13 | $0.9 \times 10^{14}$ | $1.7 \times 10^{-5}$ | 156 | 14.2 | 1300 | 1.6 | " | — |
| 14 | $1.0 \times 10^{14}$ | $1.8 \times 10^{-5}$ | 154 | 14.0 | 1290 | 1.4 | " | — |
| 15 | $1.0 \times 10^{14}$ | $1.8 \times 10^{-5}$ | 156 | 13.9 | 1280 | 1.3 | " | — |
| 16 | $0.9 \times 10^{14}$ | $1.8 \times 10^{-5}$ | 157 | 13.7 | 1260 | 1.3 | " | — |
| 17 | $1.0 \times 10^{14}$ | $1.8 \times 10^{-5}$ | 157 | 13.5 | 1250 | 1.4 | " | — |
| 18 | $0.9 \times 10^{14}$ | $1.7 \times 10^{-5}$ | 156 | 14.2 | 1300 | 1.6 | " | 0.001 |
| 19 | $1.1 \times 10^{14}$ | $1.7 \times 10^{-5}$ | 155 | 13.7 | 1270 | 1.3 | " | 0.001 |
| 20 | $1.1 \times 10^{14}$ | $1.7 \times 10^{-5}$ | 154 | 13.7 | 1260 | 1.3 | " | 0.001 |
| (Control) | | | | | | | | |
| 1 | $1.0 \times 10^{14}$ | $1.9 \times 10^{-5}$ | 156 | 15.0 | 1550 | 0.1 | good | — |
| 2 | $1.0 \times 10^{14}$ | $1.9 \times 10^{-5}$ | 155 | 15.1 | 1540 | 0.1 | " | — |
| 3 | $1.0 \times 10^{14}$ | $1.9 \times 10^{-5}$ | 157 | 15.0 | 1530 | 0.1 | " | — |
| 4 | $0.9 \times 10^{14}$ | $1.8 \times 10^{-5}$ | 156 | 14.0 | 1480 | 0.5 | bad | — |
| 5 | $1.0 \times 10^{14}$ | $1.9 \times 10^{-5}$ | 156 | 14.0 | 1430 | 0.1 | good | — |

TABLE 3-continued

| | Volume resistivity 150° C. (Ω · cm) | Thermal expansion coefficient: (1/°C.) | Glass transition temperature (°C.) | Flexural strength (kg/mm$^2$) | Flexural modulus (kg/mm$^2$) | Adhesiveness (kg/cm$^2$) | Moldability check observation | Ray dose C/cm$^2$ · h |
|---|---|---|---|---|---|---|---|---|
| 6 | 0.5 × 10$^{14}$ | 1.9 × 10$^{-5}$ | 149 | 12.5 | 1300 | 0.6 | bad | — |
| 7 | 0.1 × 10$^{14}$ | 1.7 × 10$^{-5}$ | 140 | 11.5 | 1250 | 0.9 | " | — |
| 8 | 1.0 × 10$^{14}$ | 3.2 × 10$^{-5}$ | 155 | 14.8 | 1300 | 1.0 | good | — |
| 9 | | | | nonfilled to the cavity | | | | |

Further to check the resistance of the composition to dipping in molten solder, moistureproof-testing semiconductor devices for checking the corrosion of the aluminum pattern on the semiconductor chip were sealed in flat packages (2 mm thick) made of the epoxy resin compositions at 175° C. for 3 minutes, and after-curing was performed at 180° C. for 4 hours. Later, the flat package was allowed to stand in an atmosphere having a relative humidity of 85%, and kept at a temperature of 85° C. for hours in order to subject the samples to the absorption of moisture. The samples were then dipped for 5 seconds in a solder bath kept at a temperature of 260° C. Thereafter, the solder treated flat package was tested for a predetermined length of time in saturated steam atmosphere kept at a temperature of 127° C. (PCT Test). The number of defective samples (moisture-proof test) was then determined, the results being set out in Table 4.

TABLE 4

| | Resin cracks when dipped in molten solder | Bad samples Tested sample number Moisture-proof properties test. after being dipped in molten solder | | | |
|---|---|---|---|---|---|
| | | 100 hr | 200-hr | 300 hr | 400 hr |
| (Example) | | | | | |
| 1 | 0/20 | 0/20 | 0/20 | 0/20 | 5/20 |
| 2 | 0/20 | 0/20 | 0/20 | 0/20 | 7/20 |
| 3 | 0/20 | 0/20 | 0/20 | 1/20 | 7/20 |
| 4 | 0/20 | 0/20 | 0/20 | 0/20 | 8/20 |
| 5 | 0/20 | 0/20 | 0/20 | 0/20 | 9/20 |
| 6 | 0/20 | 0/20 | 0/20 | 0/20 | 8/20 |
| 7 | 0/20 | 0/20 | 0/20 | 0/20 | 6/20 |
| 8 | 0/20 | 0/20 | 0/20 | 0/20 | 6/20 |
| 9 | 0/20 | 0/20 | 0/20 | 0/20 | 5/20 |
| 10 | 0/20 | 0/20 | 0/20 | 0/20 | 7/20 |
| 11 | 0/20 | 0/20 | 0/20 | 0/20 | 8/20 |
| 12 | 0/20 | 0/20 | 0/20 | 0/20 | 6/20 |
| 13 | 0/20 | 0/20 | 0/20 | 0/20 | 6/20 |
| 14 | 0/20 | 0/20 | 0/20 | 0/20 | 1/20 |
| 15 | 0/20 | 0/20 | 0/20 | 0/20 | 1/20 |
| 16 | 0/20 | 0/20 | 0/20 | 0/20 | 2/20 |
| 17 | 0/20 | 0/20 | 0/20 | 0/20 | 1/20 |
| 18 | 0/20 | 0/20 | 0/20 | 0/20 | 8/20 |
| 19 | 0/20 | 0/20 | 0/20 | 0/20 | 1/20 |
| 20 | 0/20 | 0/20 | 0/20 | 0/20 | 2/20 |
| (Control) | | | | | |
| 1 | 5/20 | 20/20 | | | |
| 2 | 4/20 | 20/20 | | | |
| 3 | 3/20 | 20/20 | | | |
| 4 | 1/20 | 2/20 | 4/20 | 20/20 | |
| 5 | 2/20 | 12/20 | 20/20 | | |
| 6 | 1/20 | 1/20 | 3/20 | 10/20 | 20/20 |
| 7 | 2/20 | 0/20 | 2/20 | 5/20 | 18/20 |
| 8 | 3/20 | 20/20 | | | |
| 9 | 2/20 | 0/20 | 1/20 | 14/20 | 15/20 |

In the same manner as mentioned above, large thermal shock resistance-testing chips (8 mm × 8 mm) were molded by the epoxy resin compositions. The device was subjected to cooling-heating cycles ranging from −65° C.→room temperature→150° C. The occurrence of defective samples was determined by checking the operating behavior of the above-mentioned testing device (thermal shock-resistance test), the results being set out in Table 5.

TABLE 5

| | Bad samples Tested sample number Thermal shock test (frequency of cooling and heating cycles) | | | | | |
|---|---|---|---|---|---|---|
| | 100 | 200 | 300 | 500 | 1000 | 1500 |
| (Examples) | | | | | | |
| 1 | 0/20 | 0/20 | 0/20 | 0/20 | 1/20 | 3/20 |
| 2 | 0/20 | 0/20 | 0/20 | 0/20 | 2/20 | 2/20 |
| 3 | 0/20 | 0/20 | 0/20 | 0/20 | 4/20 | 10/20 |
| 4 | 0/20 | 0/20 | 0/20 | 0/20 | 2/20 | 6/20 |
| 5 | 0/20 | 0/20 | 0/20 | 0/20 | 3/20 | 5/20 |
| 6 | 0/20 | 0/20 | 0/20 | 0/20 | 1/20 | 4/20 |
| 7 | 0/20 | 0/20 | 0/20 | 0/20 | 0/20 | 6/20 |
| 8 | 0/20 | 0/20 | 0/20 | 0/20 | 0/20 | 8/20 |
| 9 | 0/20 | 0/20 | 0/20 | 0/20 | 0/20 | 2/20 |
| 10 | 0/20 | 0/20 | 0/20 | 0/20 | 3/20 | 15/20 |
| 11 | 0/20 | 0/20 | 0/20 | 0/20 | 2/20 | 5/20 |
| 12 | 0/20 | 0/20 | 0/20 | 0/20 | 3/20 | 4/20 |
| 13 | 0/20 | 0/20 | 0/20 | 0/20 | 5/20 | 10/20 |
| 14 | 0/20 | 0/20 | 0/20 | 0/20 | 0/20 | 2/20 |
| 15 | 0/20 | 0/20 | 0/20 | 0/20 | 0/20 | 1/20 |
| 16 | 0/20 | 0/20 | 0/20 | 0/20 | 0/20 | 1/20 |
| 17 | 0/20 | 0/20 | 0/20 | 0/20 | 0/20 | 1/20 |
| 18 | 0/20 | 0/20 | 0/20 | 0/20 | 4/20 | 11/20 |
| 19 | 0/20 | 0/20 | 0/20 | 0/20 | 0/20 | 2/20 |
| 20 | 0/20 | 0/20 | 0/20 | 0/20 | 0/20 | 3/20 |
| (Control) | | | | | | |
| 1 | 1/20 | 18/20 | 20/20 | | | |
| 2 | 0/20 | 15/20 | 16/20 | 20/20 | | |
| 3 | 0/20 | 16/20 | 20/20 | | | |
| 4 | 0/20 | 0/20 | 19/20 | 20/20 | | |
| 5 | 0/20 | 0/20 | 11/20 | 16/20 | 20/20 | |
| 6 | 0/20 | 0/20 | 0/20 | 4/20 | 15/20 | 20/20 |
| 7 | 0/20 | 20/20 | | | | |
| 8 | 5/20 | 20/20 | | | | |
| 9 | 0/20 | 3/20 | 20/20 | | | |

Tables 3-5 show that compared with the conventional product, the epoxy resin composition embodying the present invention has a greater adhesiveness to a frame material, has lower elasticity, undergoes lower stress, and is consequently better adapted to seal electronic and electric parts and also to be impregnated therein.

The epoxy resin composition representing the present invention offers further advantages in that the composition is suited for use with a resin-seal type semiconductor device, is highly moisture-proof, and has a satisfactory degree of adhesiveness to a lead frame, and is consequently particularly suitable as a flat package resin composition for dipping in molten solder.

As has been mentioned above, the epoxy resin composition embodying the present invention is notably characterized in that the product is rendered highly moisture-proof, is much better able to withstand dipping in molten solder, more effectively resists thermal shock, and consequently is particularly well-adapted for sealing electronic and electrical parts. A semiconductor apparatus sealed in the epoxy resin composition representing the present invention proves to be highly reliable even when subjected to the tremendously rigorous conditions of high humidity, elevated temperature, and thermal shock.

What is claimed is:

1. An epoxy resin composition comprising:
   (A) 100 parts by weight of epoxy resin;
   (B) 30–75 parts by weight of phenolic resin;
   (C) 320–570 parts by weight of silica powder whose surface is treated, at room temperature, by a mixture of
      (i) 0.05–1.00% by weight of silane coupling agent,
      (ii) 0.05–1.00% by weight of a silicone base surface active agent,
      (iii) 0.15–3.00% by weight of thermosetting silicone rubber; and
   (D) 2–30 parts by weight of styrene-butadiene-methyl methacrylate copolymer which is a graft copolymer in which the methyl methacrylate is graft-polymerized on the styrene butadiene copolymer.

2. An epoxy resin composition according to claim 1, wherein phenolic resin (B) is a novolak type phenolic resin containing 10–70% by weight of phenol aralkyl resin.

3. An epoxy resin composition according to claim 1, wherein the silica powder is prepared from fused silica; and the total content of uranium and thorium is less than 1.0 ppb by weight.

4. A semiconductor device sealed by an epoxy resin composition, said epoxy resin composition containing:
   (A) 100 parts by weight of epoxy resin;
   (B) 30–75 parts by weight of phenolic resin;
   (C) 320–570 parts of silica powder whose surface is treated, at room temperature, by a mixture of
      (i) 0.05–1.00% by weight of silane coupling agent,
      (ii) 0.05–1.00% by weight of a silicone base surface active agent, and
      (iii) 0.15–3.00% by weight of thermosetting silicone rubber; and
   (D) 2–30 parts by weight of styrene-butadiene-methyl methacrylate copolymer which is a graft copolymer in which the methyl methacrylate is graft-polymerized on the styrene butadiene copolymer.

5. A semiconductor device sealed by a resin according to claim 4, wherein phenolic resin (B) is a novolak type phenolic resin which contains 10–70% by weight of phenol aralkyl resin.

6. A semiconductor device sealed by a resin according to claim 4, wherein silica powder is prepared from fused silica; and the total content of uranium and thorium is 1.00 ppb by weight.

7. An epoxy resin composition according to claim 1, wherein said styrene-butadiene-methyl methacrylate copolymer is in the form of powder.

8. A semiconductor device according to claim 4, wherein said styrene-butadiene-methyl methacrylate copolymer is in the form of a powder.

* * * * *